(12) United States Patent
Li

(10) Patent No.: US 12,156,358 B2
(45) Date of Patent: Nov. 26, 2024

(54) CIRCUIT BOARD FIXING BASE

(71) Applicant: Na Li, Dongguan (CN)

(72) Inventor: Na Li, Dongguan (CN)

( * ) Notice: Subject to any disclaimer, the term of this patent is extended or adjusted under 35 U.S.C. 154(b) by 181 days.

(21) Appl. No.: 18/154,852

(22) Filed: Jan. 16, 2023

(65) Prior Publication Data

US 2023/0232563 A1 Jul. 20, 2023

(30) Foreign Application Priority Data

Jan. 17, 2022 (CN) .......................... 202210047914.8

(51) Int. Cl.
*H05K 7/12* (2006.01)
*H05K 7/14* (2006.01)
(52) U.S. Cl.
CPC ............. *H05K 7/12* (2013.01); *H05K 7/1404* (2013.01); *H05K 7/1407* (2013.01)
(58) Field of Classification Search
CPC ....... H05K 7/12; H05K 7/1404; H05K 7/1407

USPC ......................................................... 361/804
See application file for complete search history.

(56) References Cited

U.S. PATENT DOCUMENTS 10,465,735 B1 * 11/2019 Hsieh .................... F16B 37/043
11,347,280 B1 * 5/2022 Hsieh .................... H05K 7/1405

* cited by examiner

*Primary Examiner* — Binh B Tran

(57) ABSTRACT

A circuit board fixing base comprises a fixing base fixed on the electric circuit board. The fixing base is configured with carrier for carrying the electronic device and elastic locking arm located beside the carrier. The upper end of the elastic locking arm has a locking body to catch the electronic device so as to lock the electronic device on the carrier. Between the locking body and the carrier, a locking space is formed to lock the electronic device. The upper end of the locking body is configured with a guiding slope. When the electronic device is pressed on the guiding slope, the upper end of the elastic locking arm will be bent outward. The electronic device can be locked on the fixing base simply by pressing down the other end of the electronic device.

10 Claims, 12 Drawing Sheets

CIRCUIT BOARD FIXING BASE

BACKGROUND OF INVENTION

1. Field of the Invention

The present invention relates generally to the field of electronic technology, and more particularly to a circuit board fixing base.

2. Description of Related Art

To connect and assemble an electronic device (such as an M.2 solid state disk) onto the electric circuit board, firstly, one end of the electronic device shall be plugged into the connector configured on the circuit board for electric connection. The other end of the electronic device is placed on the positioning column configured on the electric circuit board, and a screw is used to go through the hole on the circuit board to be screwed onto the positioning column, so that the other end of the electronic device is locked on the electric circuit board. Thus, the whole electronic device is stably assembled on the electric circuit board, and stable electric connection is ensured between the electronic device and the electric circuit board.

In the above assembly method, as the locking uses screws, when mounting or removing the electronic device, the operation to remove the screws is quite complicated and the assembly is slow and inefficient. Moreover, as the screws are very small, during the assembly, the screws may easily get lost, causing a lot of frustration to the operators.

In view of this, the inventor has developed the following technical solution.

SUMMARY OF THE INVENTION

The purpose of the present invention is to overcome the deficiencies of the prior art and provide a circuit board fixing base.

In order to solve the problems of the technologies described above, the present invention adopts the following technical solutions:

A circuit board fixing base, comprising a fixing base fixed on a circuit board and including a carrier for carrying an electronic device and an elastic locking arm located beside the carrier, an upper end of the elastic locking arm having a locking body for fastening and fixing with the electronic device to lock the electronic device on the carrier, a locking space for locking the electronic device being formed between the locking body and the carrier, and a guiding slope being provided on an upper end of the locking body, wherein when the electronic device is pressed on the guiding slope, the upper end of the elastic locking arm is forced to bend and deform outward.

More preferably, wherein an outside of an upper end of the elastic locking arm is configured with a handle.

More preferably, wherein the carrier includes a base body formed integrally on the fixing base, a limiting boss formed on an upper end of the base body, and a bearing groove formed between the periphery of the limiting boss and the upper end of the base body; the locking body is placed above the bearing groove, the shape of the limiting boss is adapted to the shape of a positioning opening at the end of the electronic device, and the limiting boss is embedded in the positioning opening.

More preferably, wherein the elastic locking arm is a plastic component or a die-casting component, which is fixed on the fixing base through integral molding, and forms an inseparable whole with the fixing base.

More preferably, wherein the elastic locking arm is an independent metal component, which is installed on the fixing base through assembly.

More preferably, wherein the elastic locking arm is in the shape of U or V, the upper end of the fixing base is configured with a moving groove, the elastic locking arm is inserted into the moving groove, and bends and deforms in the moving groove.

More preferably, wherein the elastic locking arm includes a main part, an arch-shaped bent part formed at a lower end of the main part, an elastic arm formed on an upper end of the arch-shaped bent part and the two locking bodies respectively bent and formed on both sides of an upper end of the elastic arm, the locking body is extended out of a front end of the elastic arm, the main part is stamped to a locking plate for clamping and positioning with an inner wall of the moving groove for positioning.

More preferably, wherein the inner wall of the moving groove is configured with a limiting slot, the two sides of the main part are formed with a limiting plate protruding outward, the limiting plate is clasped and fixed on the inner wall of the limiting slot, so that the main part can be fixed inside the moving groove, the elastic arm is placed inside the moving groove, and can be bent and deformed inside the moving groove, the upper end of the elastic arm is extended out of the upper end of the moving groove.

More preferably, wherein the lower end of the fixing base is formed with a threaded column, and the circuit board is fixed with a row of nuts, the fixing base is fixed on any of the nuts through the threaded column, so as to be fixed on the circuit board.

More preferably, wherein the periphery of the nut is configured with a positioning groove, one side wall of the positioning groove is configured as a first inclined guiding face, the lower end of the fixing base is formed with a limiting convex block adapted to the positioning groove, and the limiting convex block is formed with a second inclined guiding face, so that the limiting convex block can slide into the positioning groove.

Comparing with the prior art, the present invention has the following benefits and advantages:

During usage of the present invention, one end of the electronic device is connected to the connector configured on the electric circuit board, the other end of the electronic device is pressed from the top down on the guiding slope on the upper end of the locking body. Through the guiding slope, the upper end of the elastic locking arm is deformed and bent outward, so that the electronic device can be further pressed down. When the other end of the electronic device is pressed down till it passes the locking body, the elastic locking arm is reset through its own elastic force, so that the locking body is pressed on the upper end face of the other end of the electronic device, and the other end of the electronic device is locked inside the locking space. In this way, the electronic device can be fixed on the electric circuit board. Through the connector, it forms stable electric connection with the electric circuit board. Based on the present invention, the other end of the electronic device can be locked on the circuit board simply by pressing down the other end of the electronic device. The operation is very easy and convenient, and the electronic device can be replaced quickly. The assembly becomes very efficient, saving the need of a screw driver to remove the screws, as is the case in the conventional way. With less operation time, simpler structure and less components, the product based on the present invention will become very competitive.

DETAILED DESCRIPTION OF THE INVENTION

Embodiment 1

Figure 1:
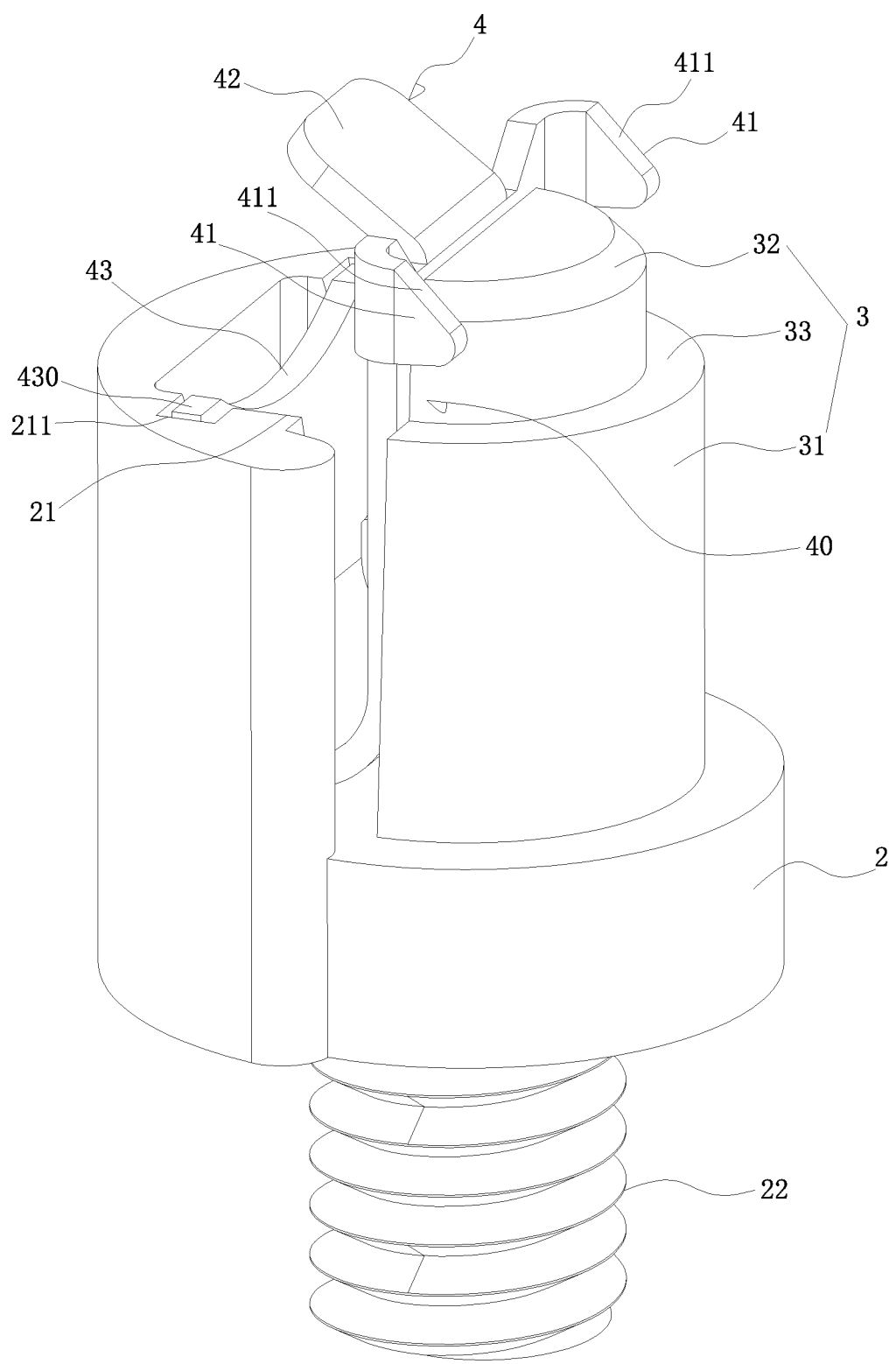
FIG. 1 is a perspective view of Embodiment 1 of the present invention.
Figure 2:
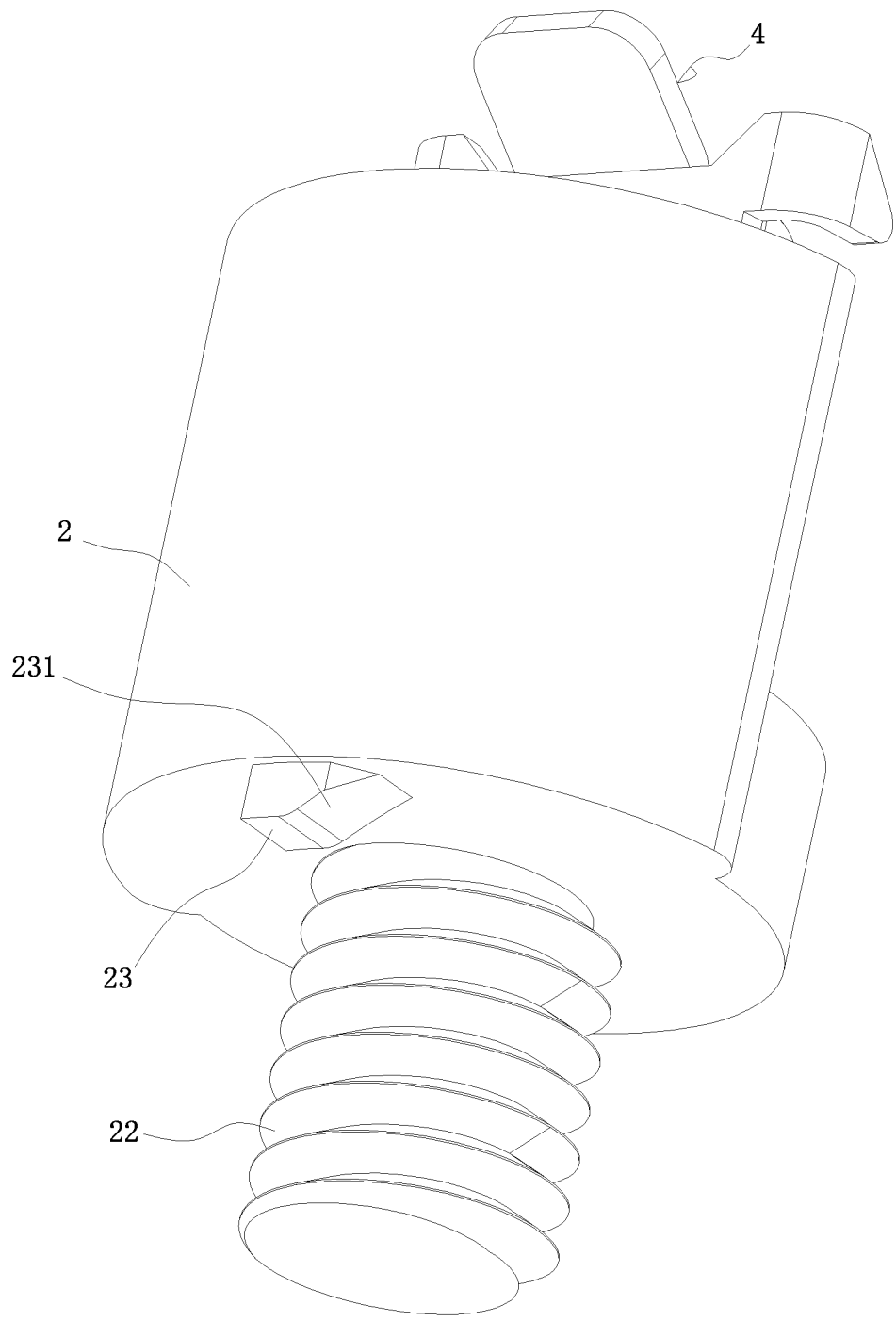
FIG. 2 is a perspective view of Embodiment 1 of the present invention from another viewing angle.
Figure 3:
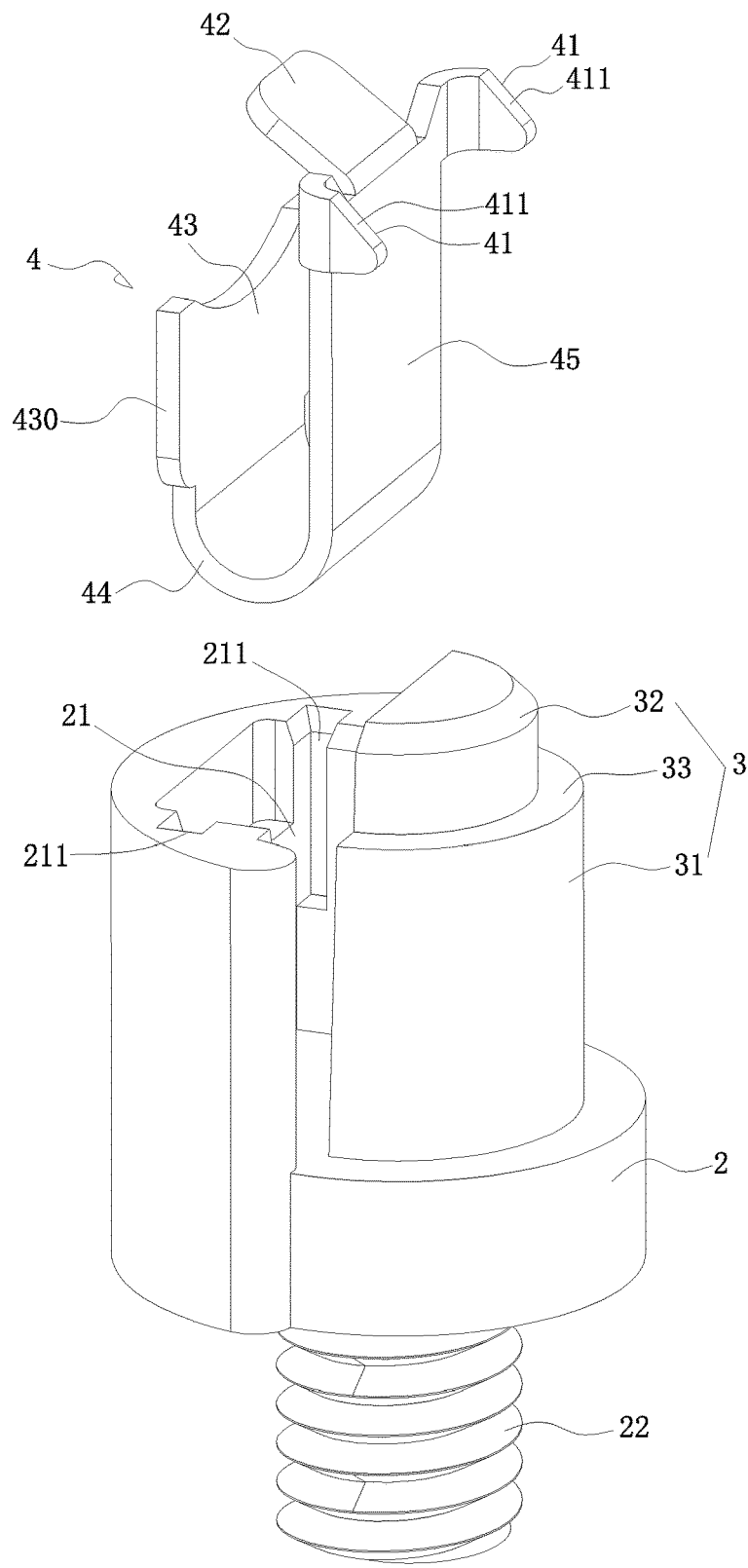
FIG. 3 is an exploded perspective view of Embodiment 1 of the present invention.
Figure 4:
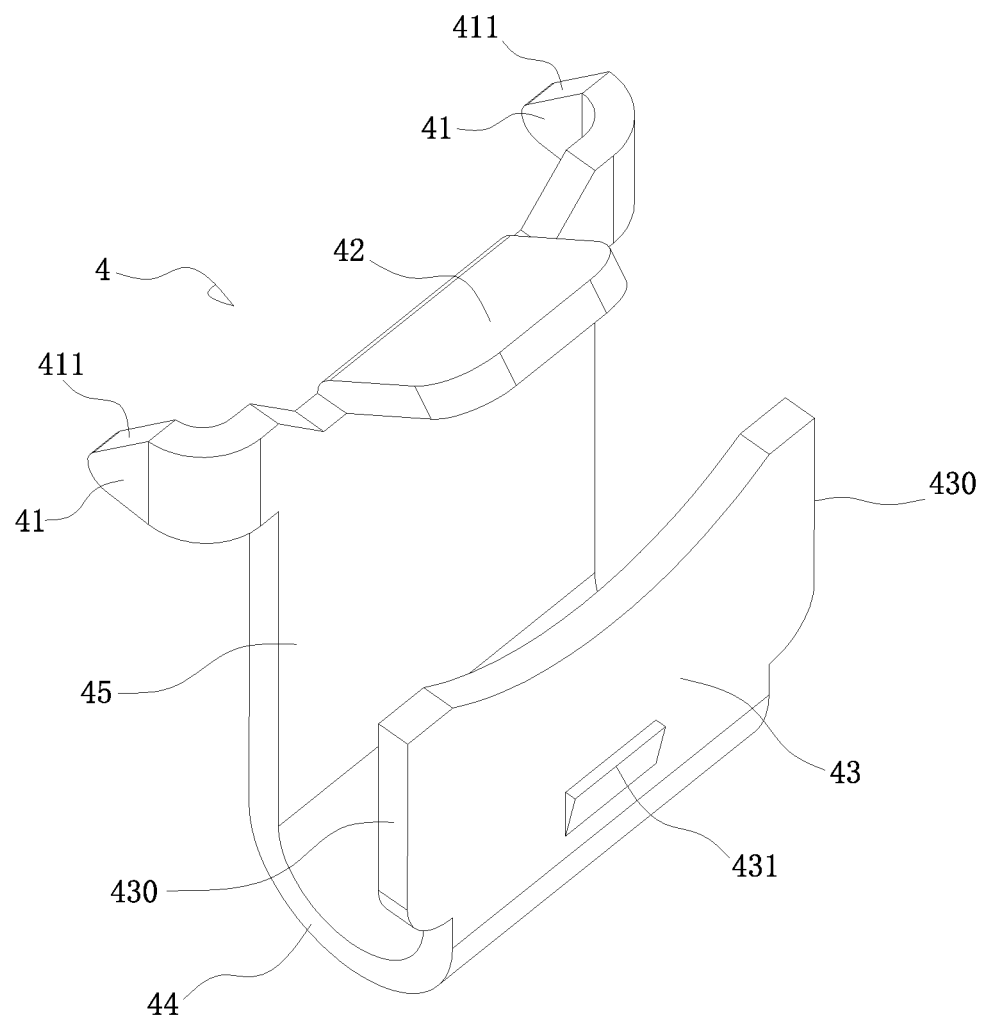
FIG. 4 is a perspective view of the elastic locking arm in Embodiment 1 of the present invention.
Figure 5:
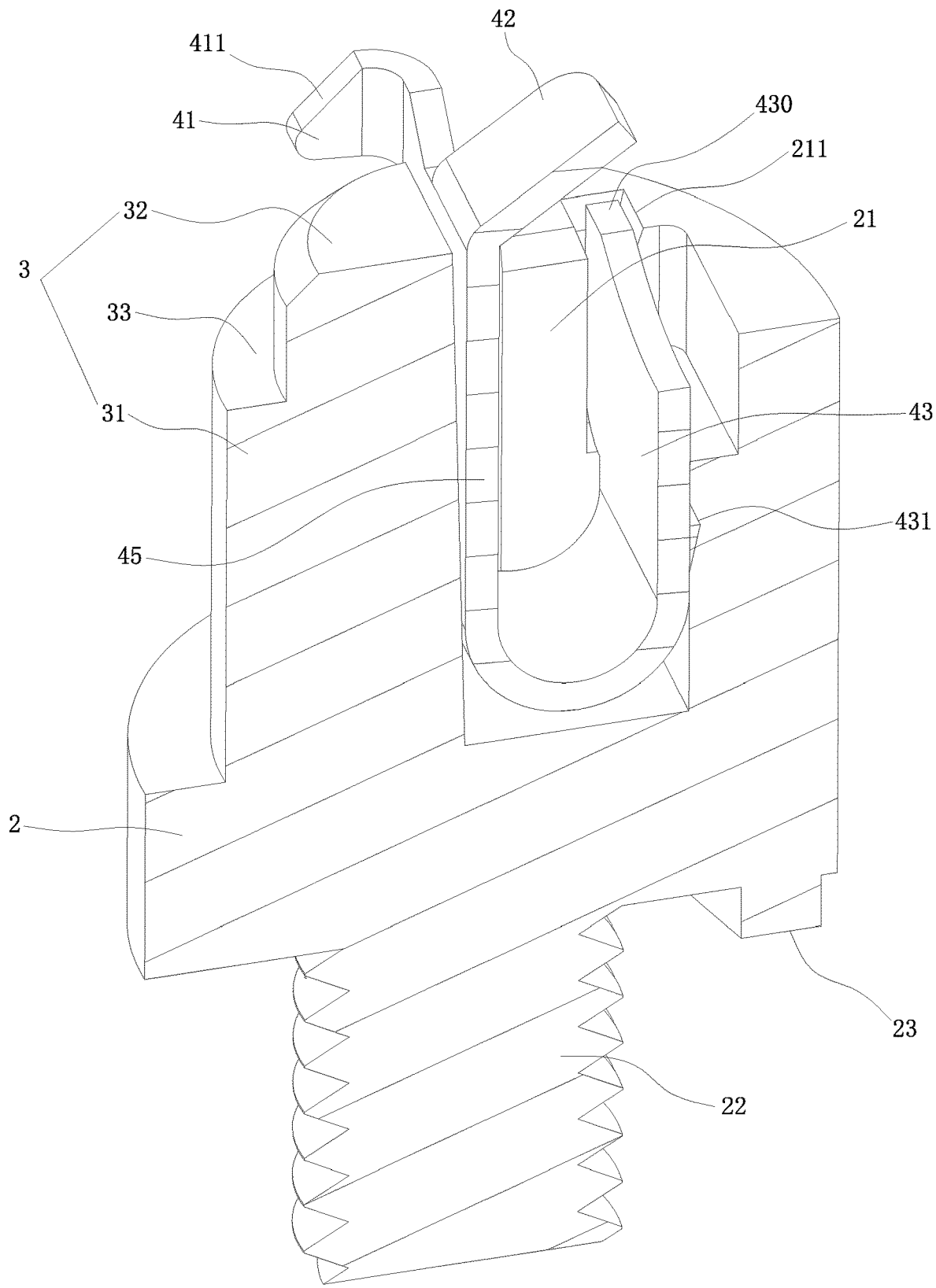
FIG. 5 is a perspective view of Embodiment 1 of the present invention.
Figure 6:
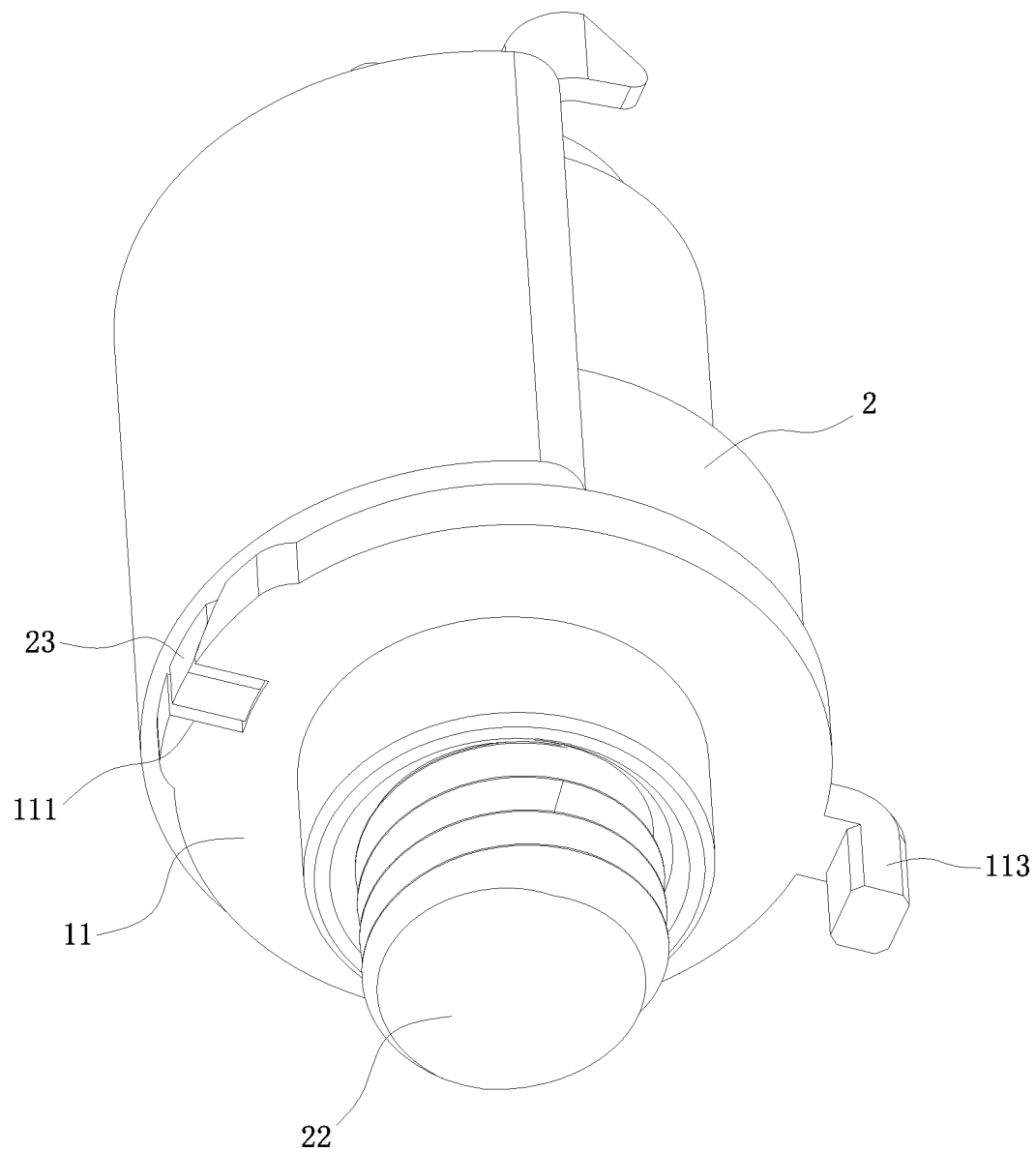
FIG. 6 is an assembled view of Embodiment 1 of the present invention with the nut.
Figure 7:
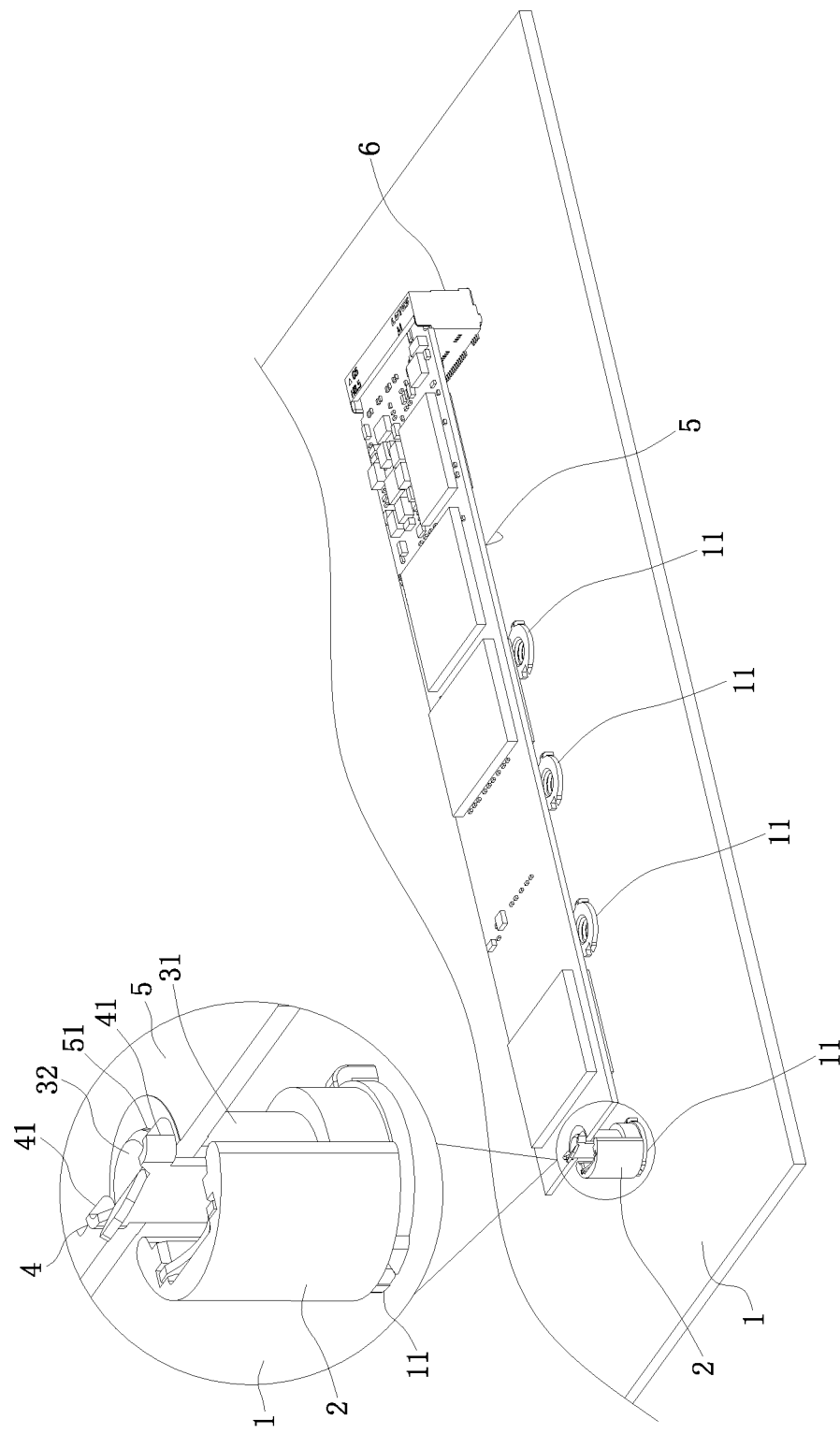
FIG. 7 is an assembled view of Embodiment 1 of the present invention with the circuit board and the electronic device.
Figure 8:
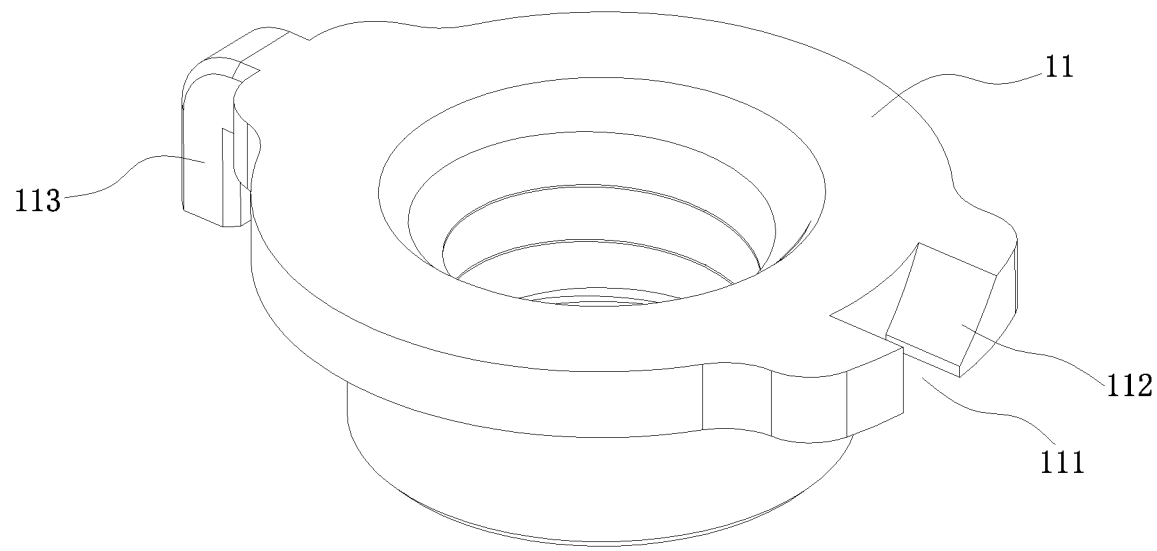
FIG. 8 is a perspective view of the nut in Embodiment 1 of the present invention.

Depicted in FIGS. 1-8 is the circuit board fixing base, which comprises a fixing base 2 fixed on the circuit board 1. The circuit board 1 is configured with a connector 6. One end of the electronic device 5 is connected to the connector 6, and the other end is loaded on the fixing base 2 and can be locked by the fixing base 2.

The connector 6 is fixed on the circuit board 1 for assembly of the electronic device 5, to form stable electric connection for data transmission. In the present embodiment, the electronic device 5 is an M.2 solid state disk. The M.2 solid state disk is inserted into the connector 6, and has the function to pop up, i.e., the connector 6 can enable the other end of the M.2 solid state disk to turn up. The M.2 solid state disk is a solid state disk with an M.2 interface. Due to its small size and high-speed data transmission performance, it is widely used in electric circuit boards. For instance, most current computers use M.2 solid state disks.

The fixing base 2 is configured with a carrier 3 and an elastic locking arm 4 located beside the carrier 3. The elastic locking arm 4 can be deformed elastically. In particular, the carrier 3 is integrally formed on the fixing base 2. They form a whole body. The carrier 3 is used to load the electronic device 5. The upper end of the elastic locking arm 4 has a locking body 41 to couple with the electronic device 5 so as to lock the electronic device 5 on the carrier 3. Between the locking body 41 and the carrier 3, a locking space 40 for locking the electronic device is formed. That is to say, the other end of the electronic device 5 is loaded on the carrier 3, and the locking body 41 is coupled on the upper end face of the other end of the electronic device 5, so that the electronic device 5 is locked on the carrier 3, and is placed inside the locking space 40.

The upper end of the locking body 41 is configured with a guiding slope 411. When the electronic device 5 is pressed on the guiding slope 411, the upper end of the elastic locking arm 4 is bent outward.

During usage of the present invention, one end of the electronic device 5 is connected to the connector 6 on the circuit board 1, whereas the other end of the electronic device 5 is pressed from top down upon the guiding slope 411 on the upper end of the locking body 41. Through the guiding slope 411, the upper end of the elastic locking arm 4 is bent outward, so that the electronic device 5 can be further pressed down. After the other end of the electronic device 5 passes the locking body 41, the elastic locking arm 4 will be recovered by its own elastic force, so that the locking body 41 is pressed on the other end of the electronic device 5, and the other end of the electronic device 5 is locked inside the locking space 40. Thus, the electronic device 5 is fixed on the circuit board 1, and through the connector 6, it can form stable electric connection with the circuit board 1. Through the present invention, the other end of the electronic device 5 can be locked on the circuit board 1 simply by pressing down the other end of the electronic device 5. The operation is very easy and convenient. The electronic device 5 can be replaced quickly with a high assembly efficiency, saving the need of a screw driver to remove the screws in the traditional method. The reduced assembly time, simpler structure and less components will make the product more competitive in the market.

The outside of the upper end of the elastic locking arm 4 is configured with a handle 42. To unlock the electronic device 5 locked by the locking body 41, the operator can directly use a finger to push the handle 42 of the elastic locking arm 4 to bend the elastic locking arm 4 till the locking body 41 of the elastic locking arm 4 goes beyond the other end of the electronic device 5, and the other end of the electronic device 5 can be moved upward to leave the locking body 41 of the elastic locking arm 4. Thus, the electronic device 5 can be unlocked. The operation is very easy and convenient. After releasing the handle 42 of the elastic locking arm 4, the elastic locking arm 4 will be automatically reset under its own elasticity and be prepared for the next locking.

The carrier 3 comprises a base body 31 integrally formed on the fixing base 2 and a limiting boss 32 formed on the upper end of the base body 31. Between the periphery of the limiting boss 32 and the upper end of the base body 31, a bearing groove 33 is formed. The locking body 41 is placed above the bearing groove 33. The bearing groove 33 is used to load the other end of the electronic device 5, and to position the other end of the electronic device 5. Specifically, the shape of the limiting boss 32 matches the shape of the positioning opening 51 on the end part of the electronic device 5. The limiting boss 32 is embedded into the positioning opening 51, so as to position the other end of the electronic device 5.

The fixing base 2 and the elastic locking arm 4 are assembled as follows: the elastic locking arm 4 is an independent metal component, and is mounted on the fixing base 2 through assembly. The structure is a two-piece structure. The elastic locking arm 4 made of metal has the advantage of a high elastic performance.

The elastic locking arm 4 is shaped like the letter U or V. The upper end of the fixing base 2 is configured with a moving groove 21. The elastic locking arm 4 is inserted into the moving groove 21, and can be bent inside the moving groove 21. When pressed, the elastic locking arm 4 can be bent freely to ensure a high performance.

The elastic locking arm 4 comprises a main part 43, an arch-shaped bent part 44 formed through bending on the lower end of the main part 43, an elastic arm 45 formed through bending and extending on the upper end of the arch-shaped bent part 44, and two locking bodies 41 respectively formed through bending on the two sides of the upper end of the elastic arm 45. The locking body 41 is extended out of the front end of the elastic arm 45. The main part 43 is die-pressed with a locking plate 430 to catch the inner wall of the moving groove 21 for positioning. The inner wall of the moving groove 21 is configured with a limiting slot 211. The two sides of the main part 43 are formed with limiting plates 431 protruding outward. The limiting plate 431 is clasped and fixed on the inner wall of the limiting slot 211. The locking plate 430 of the main part 43 is caught on the inner wall of the moving groove 21 for positioning, so that the main part 43 is fixed inside the moving groove 21. The elastic arm 45 is placed inside the moving groove 21, and can be bent and deformed inside the moving groove 21. The upper end of the elastic arm 45 is extended out of the upper end of the moving groove 21.

The lower end of the fixing base 2 is formed with a threaded column 22. The circuit board 1 is fixed with a row of nuts 11. The fixing base 2 is spirally fixed in any of the nuts 11 through the threaded column 22, so as to be fixed on the circuit board 1, without damaging the circuit board 1. Furthermore, as the circuit board 1 is fixed with a row of nuts 11, and the plurality of nuts 11 respectively have different distance from the connector 6. Therefore, electronic devices 5 of different lengths can be locked on the circuit board 1. Specifically, in the case of a long electronic device 5, the threaded column 22 of the fixing base 2 can be mounted on the nut 11 by turning a nut 11 relatively far from the connector 6. The fixing base 2 is fastened on the nut 11. Later, the elastic locking arm 4 can be used to lock the electronic device 5. Therefore, the present invention can be used to lock electronic devices of different sizes, and can be used in more occasions and with more convenience.

The periphery of the nut 11 is configured with a positioning groove 111. One side wall of the positioning groove 111 is configured as a first inclined guiding face 112. The lower end of the fixing base 2 is formed with a limiting convex block 23 to match the positioning groove 111, and the limiting convex block 23 is formed with a second inclined guiding face 231. The limiting convex block 23 slides into the positioning groove 111. In actual use, the fixing base 2 is spirally mounted on the nut 11 through the threaded column 22. After being turned to a specific extent, the limiting convex block 23 will slide into the positioning groove 111, ensuring a relative position of the upper end of the locking body 41 of the elastic locking arm 4. Thus, in a normal state, the locking body 41 is always at a position to block the electronic device 5 pressed downward. After the electronic device 5 is pressed down, it will be pressed upon the guiding slope 411 of the locking body 41.

Moreover, as one side wall of the positioning groove 111 is configured as the first inclined guiding face 112, and the limiting convex block 23 is formed with a second inclined guiding face 231, the assembly and disassembly of the fixing base 2 and the nut 11 become more convenient.

The rear side of the nut 11 is bent to form a pin 113. While the nut 11 is fit into the mounting hole on the circuit board 1, the pin 113 is embedded into the inserting hole beside the mounting hole on the circuit board 1, and thus the nut 11 is fixed on the circuit board 1.

Embodiment 2

Figure 9:
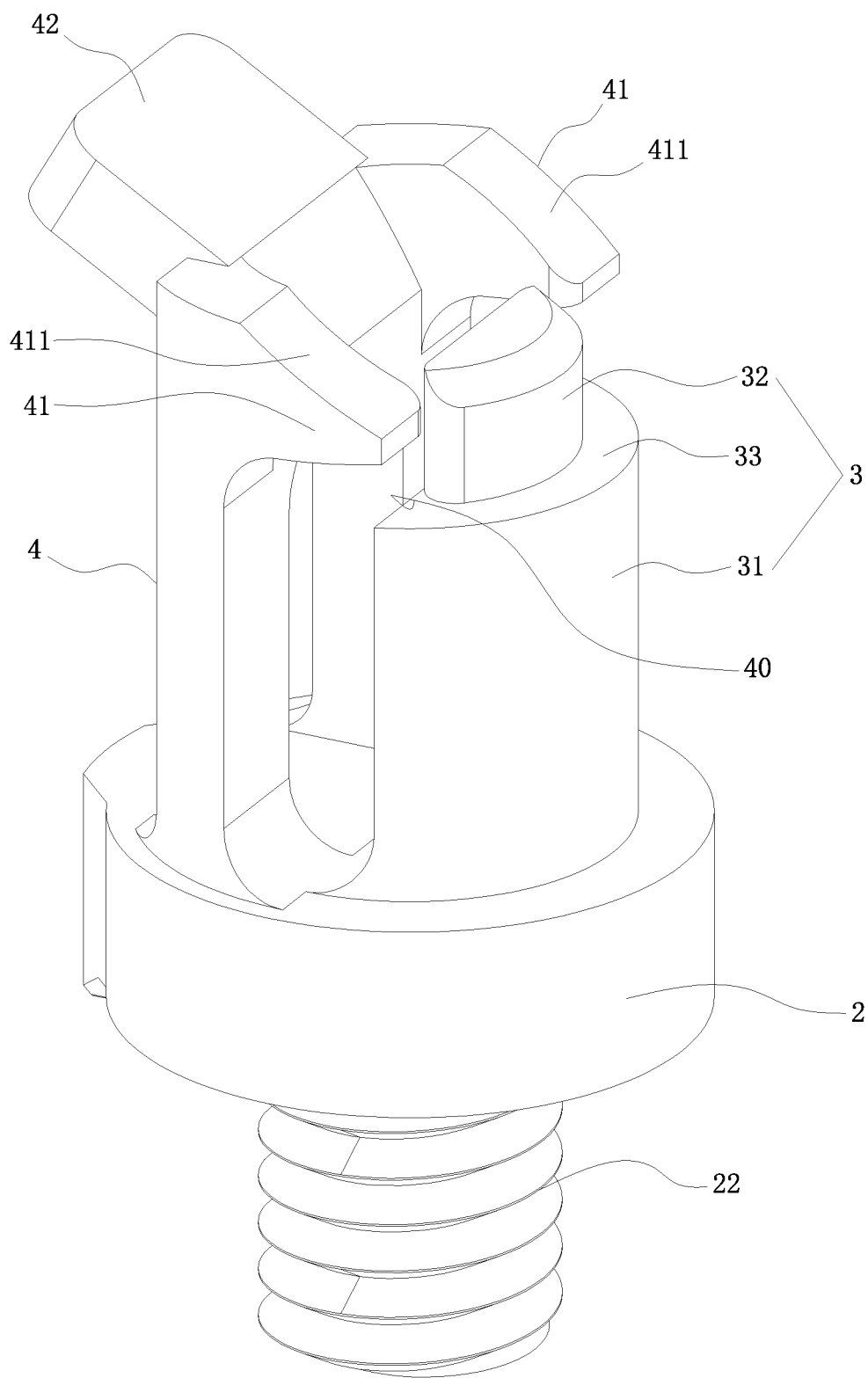
FIG. 9 is a perspective view of Embodiment 2 of the present invention.
Figure 10:
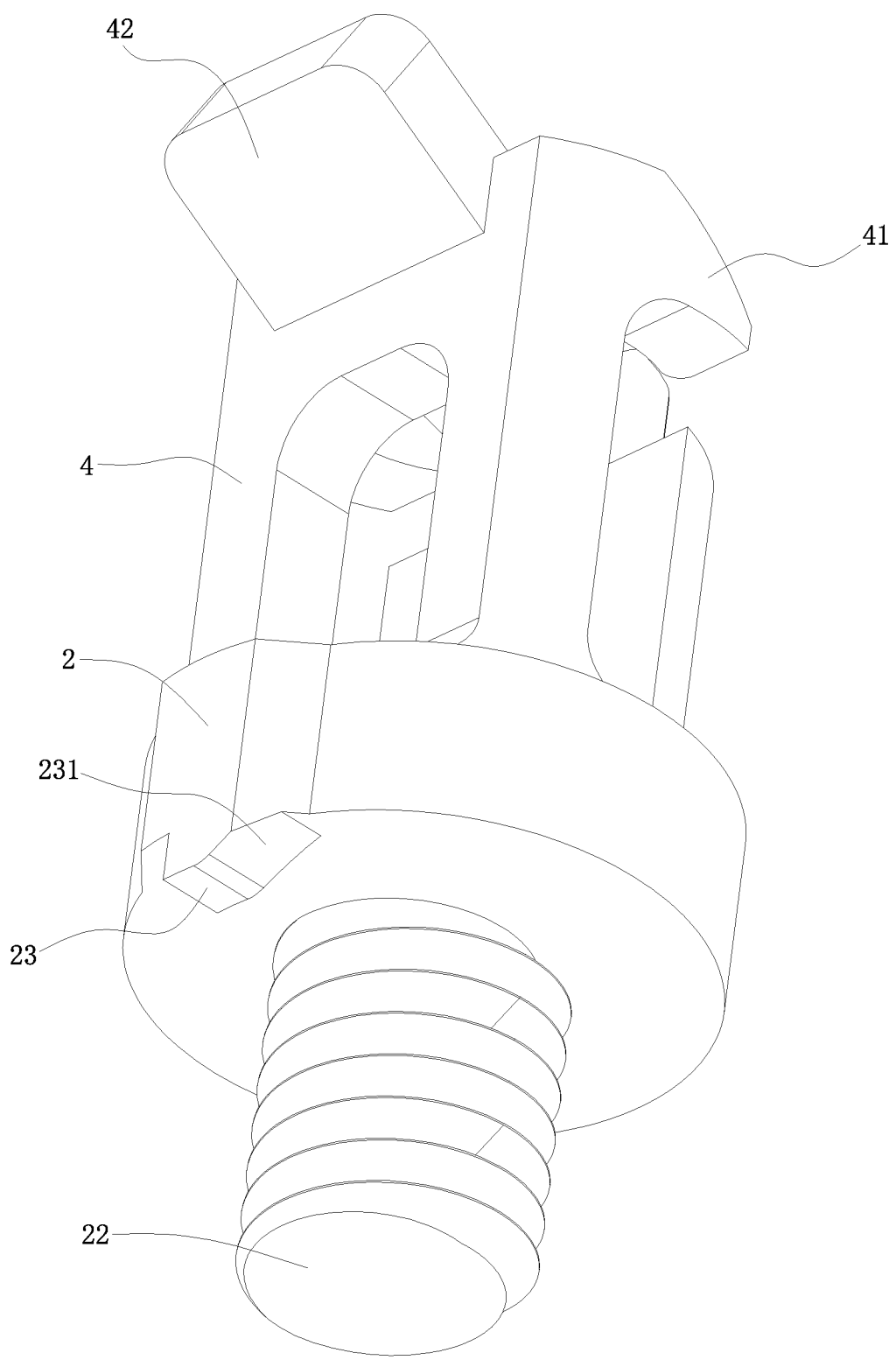
FIG. 10 is a perspective view of Embodiment 2 of the present invention from another viewing angle.
Figure 11:
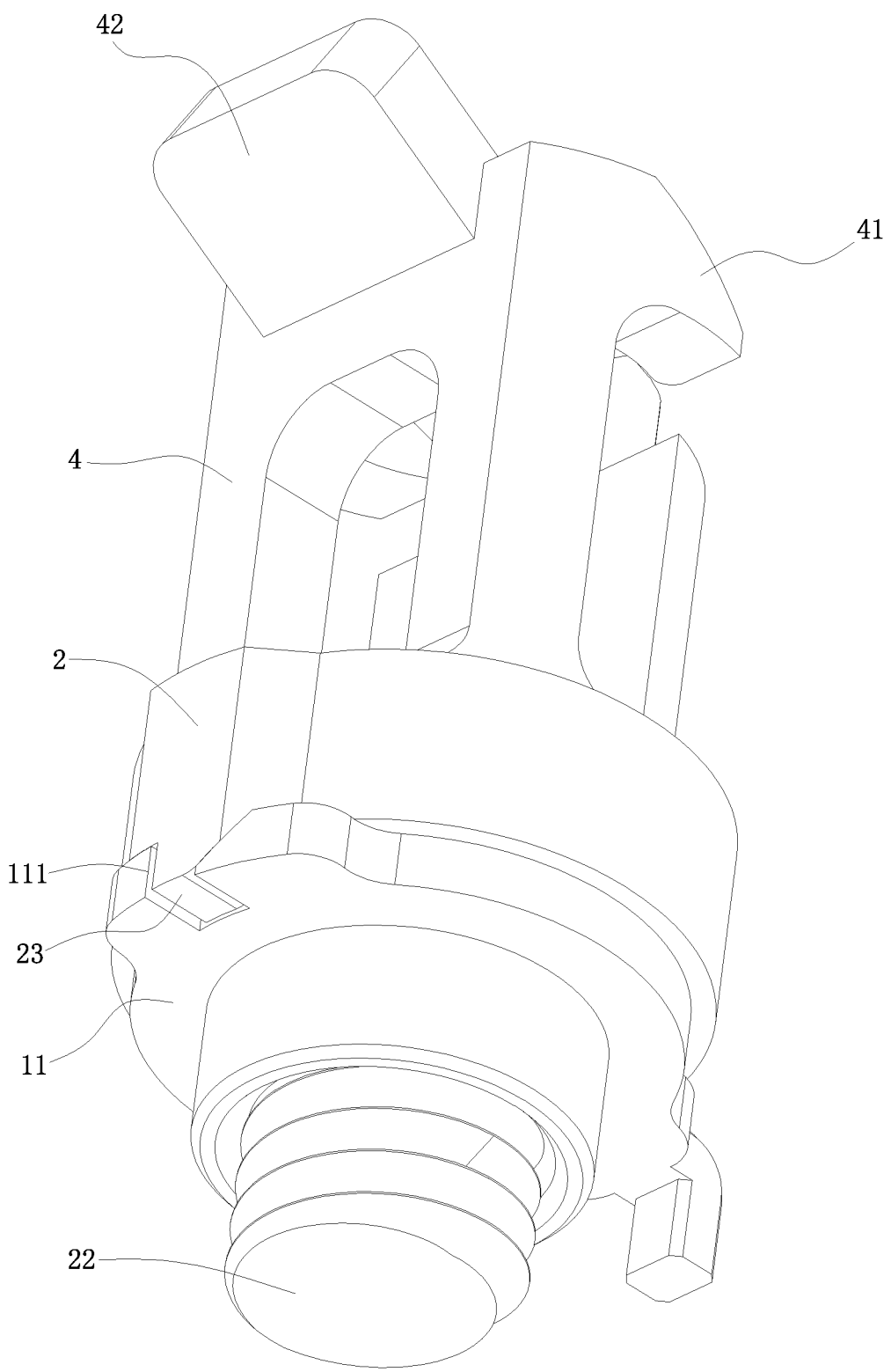
FIG. 11 is an assembled view of Embodiment 2 of the present invention with the nut.
Figure 12:
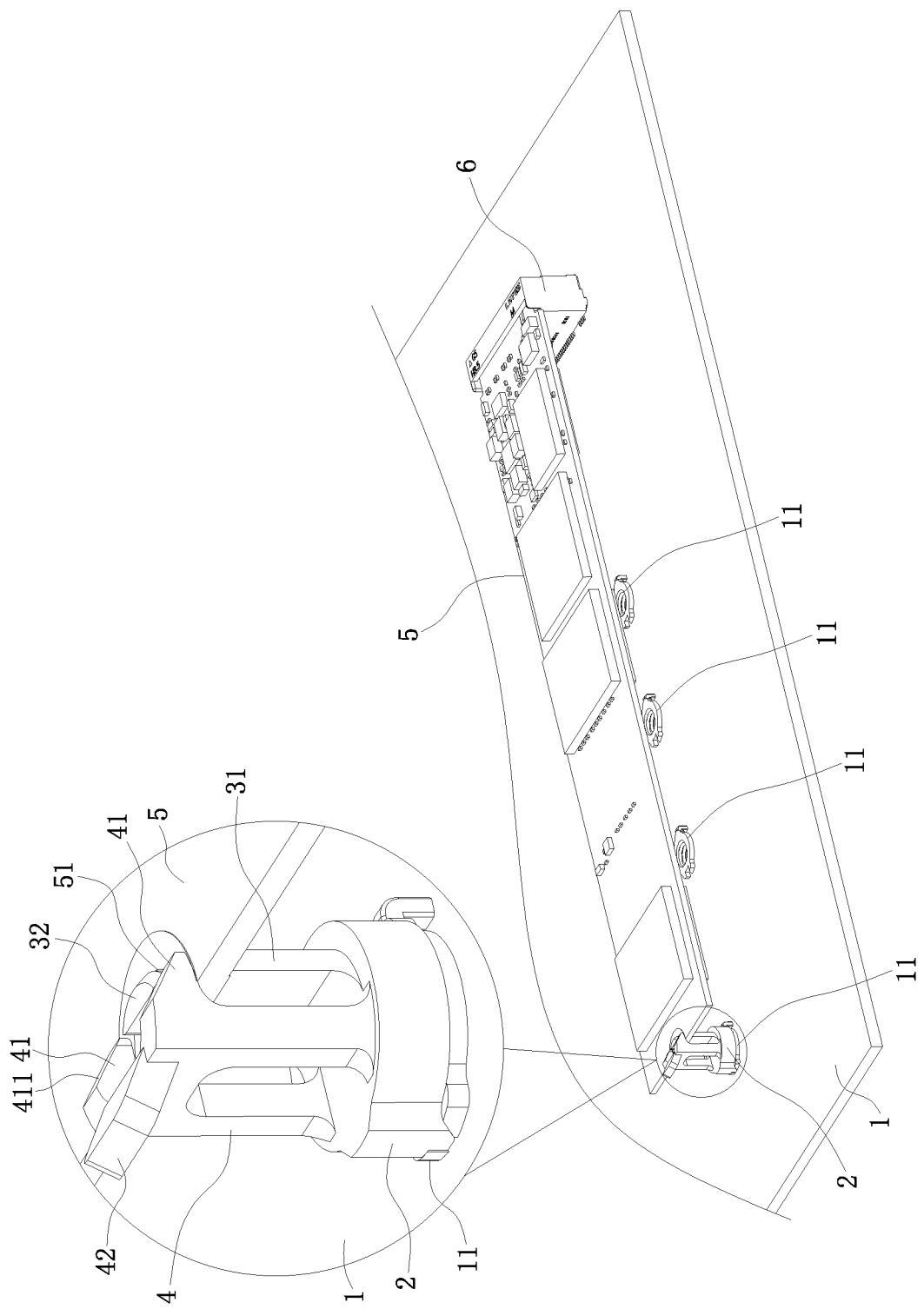
FIG. 12 is an assembled view of Embodiment 2 of the present invention with the circuit board and the electronic device.

As disclosed in FIGS. 9-12, this embodiment differs from the above Embodiment 1 in that: the elastic locking arm 4 is a plastic component or a cast component, which is fixed on the fixing base 2 through integral formation, and forms an inseparable whole with the fixing base 2. Specifically, the elastic locking arm 4 is a plastic component, it is formed on the fixing base 2 through plastic injection, and forms an inseparable whole with the fixing base 2, or, the elastic locking arm 4 is a cast component, integrally formed on the fixing base 2 through casting, and forms an inseparable whole with the fixing base 2.

In the fixing base 2 of Embodiment 2, the configuration of a moving groove 21 is not required, and assembly is no longer needed. The elastic locking arm 4 and the fixing base 2 are connected in a direct and simpler way, with less components and costs. However, comparing to the elastic locking arm 4 of a metal component, the elastic locking arm 4 of the plastic component has insufficient elasticity.

The other structural features of Embodiment 2 are similar to Embodiment 1 and can accomplish the same technical effects, and are therefore not repeated herein.

I claim:

1. A circuit board fixing base, comprising
a fixing base (2) fixed on a circuit board (1) and including a carrier (3) for carrying an electronic device (5) and an elastic locking arm (4) located beside the carrier (3), an upper end of the elastic locking arm (4) having a locking body (41) for fastening and fixing with the electronic device (5) to lock the electronic device (5) on the carrier (3), a locking space (40) for locking the electronic device (5) being formed between the locking body (41) and the carrier (3), and a guiding slope (411) being provided on an upper end of the locking body (41), wherein when the electronic device (5) is pressed on the guiding slope (411), the upper end of the elastic locking arm (4) is forced to bend and deform outward.

2. The circuit board fixing base according to claim 1, wherein an outside of an upper end of the elastic locking arm (4) is configured with a handle (42).

3. The circuit board fixing base according to claim 1, wherein the carrier (3) includes a base body (31) formed integrally on the fixing base (2), a limiting boss (32) formed on an upper end of the base body (31), and a bearing groove (33) formed between the periphery of the limiting boss (32) and the upper end of the base body (31);
the locking body (41) is placed above the bearing groove (33), the shape of the limiting boss (32) is adapted to the shape of a positioning opening (51) at the end of the electronic device (5), and the limiting boss (32) is embedded in the positioning opening (51).

4. The circuit board fixing base according to claim 1, wherein the elastic locking arm (4) is a plastic component or a die-casting component, which is fixed on the fixing base (2) through integral molding, and forms an inseparable whole with the fixing base (2).

5. The circuit board fixing base according to claim 1, wherein the elastic locking arm (4) is an independent metal component, which is installed on the fixing base (2) through assembly.

6. The circuit board fixing base according to claim 5, wherein the elastic locking arm (4) is in the shape of U or V, the upper end of the fixing base (2) is configured with a moving groove (21), the elastic locking arm (4) is inserted into the moving groove (21), and bends and deforms in the moving groove (21).

7. The circuit board fixing base according to claim 6, wherein the elastic locking arm (4) includes a main part (43), an arch-shaped bent part (44) formed at a lower end of the main part (43), an elastic arm (45) formed on an upper end of the arch-shaped bent part (44) and the two locking bodies (41) respectively bent and formed on both sides of an upper end of the elastic arm (45), the locking body (41) is extended out of a front end of the elastic arm (45), the main part (43) is stamped to a locking plate (430) for clamping and positioning with an inner wall of the moving groove (21) for positioning.

8. The circuit board fixing base according to claim 7, wherein the inner wall of the moving groove (21) is configured with a limiting slot (211), the two sides of the main part (43) are formed with a limiting plate (431) protruding outward, the limiting plate (431) is clasped and fixed on the inner wall of the limiting slot (211), so that the main part (43) can be fixed inside the moving groove (21), the elastic arm (45) is placed inside the moving groove (21), and can be bent and deformed inside the moving groove (21), the upper end of the elastic arm (45) is extended out of the upper end of the moving groove (21).

9. The circuit board fixing base according to claim 1, wherein the lower end of the fixing base (2) is formed with a threaded column (22), and the circuit board (1) is fixed with a row of nuts (11), the fixing base (2) is fixed on any of the nuts (11) through the threaded column (22), so as to be fixed on the circuit board (1).

10. The circuit board fixing base according to claim 9, wherein the periphery of the nut (11) is configured with a positioning groove (111), one side wall of the positioning groove (111) is configured as a first inclined guiding face (112), the lower end of the fixing base (2) is formed with a limiting convex block (23) adapted to the positioning groove (111), and the limiting convex block (23) is formed with a second inclined guiding face (231), so that the limiting convex block (23) can slide into the positioning groove (111).

* * * * *